United States Patent
Kasuya et al.

(10) Patent No.: US 12,024,767 B2
(45) Date of Patent: Jul. 2, 2024

(54) DIELECTRIC FILM, METHOD FOR PRODUCING SAME AND OPTICAL MEMBER USING SAME

(71) Applicant: Konica Minolta, Inc., Tokyo (JP)

(72) Inventors: Jinichi Kasuya, Kokubunji (JP); Kazunari Tada, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 555 days.

(21) Appl. No.: 17/312,925

(22) PCT Filed: Oct. 31, 2019

(86) PCT No.: PCT/JP2019/042794
§ 371 (c)(1),
(2) Date: Jun. 10, 2021

(87) PCT Pub. No.: WO2020/129424
PCT Pub. Date: Jun. 25, 2020

(65) Prior Publication Data
US 2022/0010422 A1    Jan. 13, 2022

(30) Foreign Application Priority Data
Dec. 21, 2018   (JP) .................. 2018-239799

(51) Int. Cl.
*G02B 1/115*     (2015.01)
*C23C 14/02*    (2006.01)
(Continued)

(52) U.S. Cl.
CPC ............ *C23C 14/10* (2013.01); *C23C 14/024* (2013.01); *C23C 14/081* (2013.01);
(Continued)

(58) Field of Classification Search
CPC . G02B 1/115; G02B 1/00; G02B 1/10; G02B 1/11; G02B 1/113; G02B 1/12;
(Continued)

(56) References Cited

U.S. PATENT DOCUMENTS 7,005,188 B2 *   2/2006  Anderson ............... C03C 27/10
                                                                    428/428
2017/0233287 A1 *  8/2017  Li ........................ C03C 3/089
                                                                    428/172
(Continued)

FOREIGN PATENT DOCUMENTS

JP    2001-033607 A    2/2001
JP    2002-338306 A1    11/2002
(Continued)

OTHER PUBLICATIONS

EPO, Extended European Search Report for the related European Application No. 19900306.2, dated Feb. 2, 2022.
(Continued)

*Primary Examiner* — Arnel C Lavarias
(74) *Attorney, Agent, or Firm* — LUCAS & MERCANTI, LLP

(57) ABSTRACT

A dielectric film is provided on a transparent substrate. The dielectric film has at least one low refractive index layer. An uppermost layer of the dielectric film contains $SiO_2$ and has a film density of 92% or more. The uppermost layer contains an element having an electronegativity smaller than Si.

9 Claims, 7 Drawing Sheets

(51) Int. Cl.
*C23C 14/08* (2006.01)
*C23C 14/10* (2006.01)
*C23C 14/30* (2006.01)
*C23C 14/34* (2006.01)

(52) U.S. Cl.
CPC ............ *C23C 14/083* (2013.01); *C23C 14/30* (2013.01); *C23C 14/34* (2013.01); *G02B 1/115* (2013.01)

(58) Field of Classification Search
CPC ... G02B 1/14; G02B 1/18; G02B 5/28; G02B 5/285; G02B 5/286; G02B 5/287; G02B 27/0006; G02B 2207/107; C23C 14/10; C23C 14/024; C23C 14/081; C23C 14/083; C23C 14/30; C23C 14/34; C23C 14/28; C23C 14/3442
USPC ....... 359/601, 577, 580, 581, 582, 586, 588, 359/589, 590, 609
See application file for complete search history.

(56) References Cited

U.S. PATENT DOCUMENTS

2020/0408960 A1* 12/2020 Kasuya ............... C23C 14/5873
2022/0128738 A1* 4/2022 Tada ........................ B01J 35/30

FOREIGN PATENT DOCUMENTS

| | | |
|---|---|---|
| JP | 2010-167744 A | 8/2010 |
| JP | 2013-203774 A | 10/2013 |
| JP | 2018-197171 A | 12/2018 |
| JP | 2019-002036 A | 1/2019 |
| WO | 2017/056598 A1 | 4/2017 |
| WO | 2018/110018 A1 | 6/2018 |

OTHER PUBLICATIONS

PCT, International Search Report for the corresponding application No. PCT/JP2019/042794, dated Jan. 7, 2020, with English translation.
PCT, Written Opinion of ISA for the corresponding application No. PCT/JP2019/042794, dated Jan. 7, 2020, with English translation.
Office Action issued for the related Chinese patent application No. 201980083534.6, dated Jun. 14, 2023, along with its English translation, 10 pages.
Office Action issued for the related Japanese application No. 2020-561196, mailed May 9, 2023, with English translation.
CNIPA, Office Action for the related Chinese Application No. 201980083534.6, dated Dec. 21, 2022, with English translation.
CNIPA, Office Action for the related Chinese Application No. 201980083534.6, dated Mar. 29, 2022, with English translation.
Japan Patent Office, Office Action issued for the related Japanese application No. 2020-561196, mailed Mar. 7, 2023, with English translation (8 pages).
Office Action dated Sep. 19, 2023 for the related Japanese Application No. 2020-561196, with English translation.
Office Action dated Dec. 14, 2023 for the related European Application No. 19900306.2.

* cited by examiner

DIELECTRIC FILM, METHOD FOR PRODUCING SAME AND OPTICAL MEMBER USING SAME

CROSS REFERENCE TO RELATED APPLICATION

This Application is a 371 of PCT/JP2019/042794 filed on Oct. 31, 2019, which claims priority of Japanese patent application no. 2018-239799 filed Dec. 21, 2018, the above applications are incorporated herein by reference.

TECHNICAL FIELD

The present invention relates to a dielectric film, a method of producing the same, and an optical member using the same. More specifically, the present invention relates to a dielectric film having excellent salt water resistance and scratch resistance of a surface and capable of maintaining a low water contact angle for a long period of time in a high-temperature and high-humidity environment.

BACKGROUND

In recent years, an in-vehicle camera has been mounted on a vehicle to support the driving of the vehicle. More specifically, a camera for imaging the rear and side of the vehicle is mounted on the vehicle body of the vehicle, to reduce the blind spot by displaying the image captured by the camera in a visible position by the driver, thereby contributing to safe driving.

Incidentally, in-vehicle cameras are often mounted outside the vehicle, and there are strict requirements for guaranteeing environmental resistance for the lenses used. For example, in a salt water spray test on a lens, if silicon oxide (hereinafter, referred to as $SiO_2$) which is a constituent of an antireflection layer on the lens surface is dissolved in salt water to change the optical reflectance of the antireflection layer, ghosting or flaring may occur.

In addition, water droplets and dirt such as mud often adheres to the lens. Depending on the degree of water droplets or dirt adhered to the lens, the image captured by the camera may become blurred.

Patent Document 1 discloses a method in which an antifogging and antifouling material for an organic base material containing a specific alcohol-based solvent and an organosilica sol is contacted or applied to an organic base material to swell a surface of an organic base material by the solvent, and an organosilica sol is intruded into the swollen surface to form a silica film exhibiting hydrophilicity. According to this document, it is said that an organic base material having a lower water contact angle and excellent in antifouling property, antifogging property, adhesion and durability may be obtained.

However, when an attempt is made to apply the silica film formed on the surface to an in-vehicle camera, there is a risk that surface deterioration or change of properties due to a salt water contained in a tidal wind, an acid rain, and a chemical such as a detergent used in a car wash, or a wax may occur. For example, since the surface of a silica ($SiO_2$) film of the coating system as disclosed in the cited Document 1 is porous and brittle, $SiO_2$ dissolves in the salt water spray test, and as a result, the film becomes thin, and it is difficult to maintain the above-mentioned performance. In addition, since the silica film has a porous surface, a low water contact angle (hydrophilicity) cannot be maintained for a long period of time in an environment of high-temperature and high-humidity (85° C. and 85% RH).

PRIOR ART DOCUMENTS

Patent Document

Patent Document 1: JP-A 2013-203774

SUMMARY OF THE INVENTION

Problems to be Solved by the Invention

The present invention has been made in view of the above problems and status. An object of the present invention is to provide a dielectric film which is excellent in salt water resistance and scratch resistance of a surface and capable of maintaining a low water contact angle for a long period of time in a high-temperature and high-humidity environment, a production method thereof, and an optical member using the same.

Means to Solve the Problems

In order to solve the above-mentioned problems, the present inventors have found the following in the process of examining the causes of the above-mentioned problems. That is, it has been found that when an uppermost layer of a dielectric film having an antireflection function has a specific film density, with containing at least $SiO_2$ and a specific element, the surface of the dielectric film has excellent salt water resistance and scratch resistance, and the surface can maintain a low water contact angle for a long period of time in a high-temperature and high-humidity environment. Thus, the present invention has been achieved.

In other words, the above problem according to the present invention is solved by the following means.

1. A dielectric film provided on a transparent substrate, wherein the dielectric film has at least one low refractive index layer, and an uppermost layer of the dielectric film contains $SiO_2$ and has a film density of 92% or more, and the uppermost layer contains an element having an electronegativity smaller than Si.

2. The dielectric film described in item 1, wherein the uppermost layer contains an element selected from the group consisting of sodium, calcium, potassium and magnesium.

3. The dielectric film described in item 1 or 2, wherein a content of sodium, calcium, potassium, and magnesium in the uppermost layer is in the range of 0.5 to 10% by mass, and a layer thickness of the uppermost layer is 1 µm or less.

4. The dielectric film described in any one of items 1 to 3, wherein the uppermost layer has a film density of 98% or more.

5. The dielectric film described in any one of items 1 to 3, wherein a water contact angle of the uppermost layer is 30° or less after being stored for 1000 hours in an environment of 85° C. and 85% RH.

6. The dielectric film described in any one of items 1 to 5, wherein a functional layer containing a metal oxide having a photocatalytic function as a main component is further provided on a transparent substrate side of the uppermost layer.

7. The dielectric film described in item 6, wherein the uppermost layer has a plurality of pores that partially expose a surface of the functional layer.

8. A method of producing a dielectric film provided on a transparent substrate, comprising the steps of: forming at least one low refractive index layer; and forming an uppermost layer containing $SiO_2$ and an element selected from the group consisting of sodium, calcium, potassium, and magnesium.

9. The method of producing a dielectric film described in item 8, further comprising the steps of: forming a functional layer containing a metal oxide having a photocatalytic function as a main component on a transparent substrate side of the uppermost layer; and forming a plurality of pores in the uppermost layer, the pores partially exposing a surface of the functional layer.

10. The method of producing a dielectric film described in item 8 or 9, comprising the step of forming the dielectric film by an ion assisted deposition method or a sputtering method.

11. An optical member comprising the dielectric film described in any one of items 1 to 7.

12. The optical member described in item 11, wherein the optical member is an in-vehicle lens.

Effects of the Invention

According to the above-mentioned means of the present invention, it is possible to provide a dielectric film which is excellent in salt water resistance and scratch resistance of a surface and capable of maintaining a low water contact angle for a long period of time in a high-temperature and high-humidity environment, a production method thereof, and an optical member using the same.

The expression mechanism or action mechanism of the effect of the present invention is not clarified, but is inferred as follows.

With respect to the durability (maintenance of hydrophilicity) of the $SiO_2$ containing layer in high-temperature and high-humidity (85° C. and 85% RH) environments, the hydrophilic function of the uppermost layer is further improved by containing an element having an electronegativity smaller than Si. Compared with pure $SiO_2$, $SiO_2$ that incorporates an alkali metal element is considered to have a polarity in the arrangement of the electrons, and this is considered to have affinity with the polar $H_2O$. In particular, the electronegativity difference between sodium element and O is larger than the electronegativity difference between Si and O, and an electric bias occurs. It is presumed that the content of the sodium element in the range of 0.1 to 10% by mass causes the best electrical bias and attracts water, which is a polar molecule. Among them, $Na_2O$, which is a sodium oxide, has an advantage that it is easy to form a film at the same time as $SiO_2$ as a mixed vapor deposition material because its melting point is relatively close to the melting point of $SiO_2$. There is little deviation in terms of the composition ratio of the vapor-deposited film.

In addition, for example, when sodium is contained, since NaOH derived from sodium is deliquescent, it is presumed that it has a property of taking in moisture of an external environment and to become an aqueous solution, and that hydrophilicity may be maintained for a long period of time in order to take in water in a high-temperature and high-humidity environment.

Further, in the conventional configuration of a dielectric film in which a plurality of layers containing a high refractive index layer ($Ta_2O_5$)/low refractive index layer ($SiO_2$) are alternately laminated, when the uppermost layer containing $SiO_2$ is subjected to the following salt water spray test, a phenomenon is observed in which the $SiO_2$-containing layer dissolves in salt water and the optical reflectance changes. It is considered that, for example, when the uppermost layer of the antireflection layer (dielectric film) on the lens is dissolved and peeled by the external environment (salt water) due to such a change, flare or ghost is generated, and the performance is deteriorated from the initial producing performance.

<Salt Water Spray Test>

The following (a) to (c) are set as one cycle, and eight cycles are carried out.

(a) Spray the sample surface with the following solvent at 25±2° C. for 2 hours at a temperature of 35±2° C. in a spray tank (salt water concentration: 5%).

(b) After completion of spraying, the sample is allowed to stand at 40±2° C. and 95% RH for 22 hours.

(c) (a) and (b) are repeated four times and then the sample is left at 25° C. and 55% RH for 72 h.

<Solvent>

Solutes used: NaCl, $MgCl_2$, $CaCl_2$

Solute concentration: 5±1% (mass ratio)

In the salt water spray test of the $SiO_2$ containing layer, since the pH of the salt water at 25° C. is about 7 (weakly alkaline pH), a Si—O bond is easily cut, and it is inferred that $SiO_2$ containing layer is gradually dissolved in the salt water and peeled off.

It is inferred that $SiO_2$ containing layer is easily dissolved in salt water because the surface is porous and brittle in the silica ($SiO_2$) of the coating system, but salt water resistance and scratch resistance are improved by forming a high-density $SiO_2$ containing layer in which the film density is adjusted to 92% or more by Ion Assisted Deposition (it may be simply called as "IAD") or sputtering. IAD is a method for forming a high density film by applying high kinetic energy of ions during film formation and increasing the adhesion between the film and the base material, and is preferable applied as a means for improving the durability of the uppermost layer.

EMBODIMENTS TO CARRY OUT THE INVENTION

Figure 1:
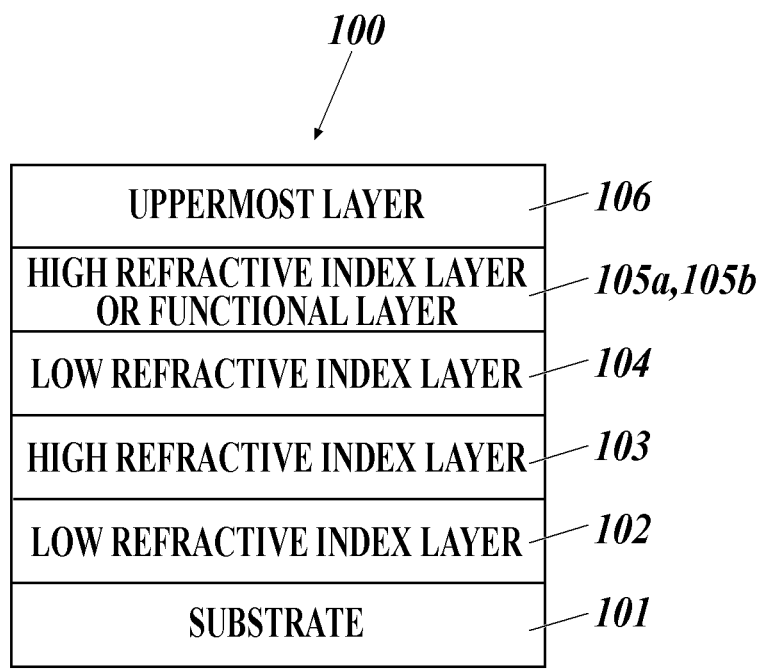
FIG. 1 is a cross-sectional view showing an example of the structure of the dielectric film of the present invention.

The dielectric film of the present invention is a dielectric film provided on a transparent substrate, wherein the dielectric film has at least one low refractive index layer, an uppermost layer of the dielectric film contains $SiO_2$, and the uppermost layer has a film density of 92% or more, and the uppermost layer contains an element having an electronegativity smaller than Si. This feature is a technical feature common to or corresponding to the following embodiments.

As an embodiment of the present invention, from the viewpoint of expressing the effect of the present invention, it is preferable that the uppermost layer contains an element selected from the group consisting of sodium, calcium, potassium and magnesium, and in addition, the content thereof is within a range of 0.5 to 10% by mass in the uppermost layer, and the layer thickness is 1 μm or less, because an excellent hydrophilicity maintaining effect is exhibited for long-term storage under a high-temperature and high-humidity environment. Incidentally, when 2 kinds or more elements are contained, the content is in the range indicating the total amount.

When the content is 0.5% by mass or more, the effect of maintaining low hydrophilicity under high-temperature and high-humidity environments is exhibited, and when the content is 10% by mass or less, dissolution of $SiO_2$ does not occur and antireflection properties are not affected.

Further, it is preferable that the film density of the uppermost layer is 98% or more because it exhibits excellent salt water resistance and scratch resistance. The film density is preferably in the range of 98 to 100% from the viewpoint of salt water resistance and scratch resistance.

In addition, it is preferable that the water contact angle of the uppermost layer is 30° or less after 1000 hours of storage in an 85° C. and 85% RH environment, and hydrophilicity may be exhibited over a long period of time. The hydrophilic property referred to in the present invention means that the water contact angle is 30° or less, preferably 15° or less. A case of 15° or less is defined in the present invention as "superhydrophilic".

Further, it is preferable to have a functional layer containing a metal oxide having a photocatalytic function as a main component on the transparent substrate side of the uppermost layer from the viewpoint of self-cleaning the stain adhering to the uppermost layer by the photocatalytic function.

In this case, it is preferable that the uppermost layer has a plurality of pores for partially exposing the surface of the functional layer from the viewpoint of effectively expressing the self-cleaning effect. If the film is formed under the conditions of conventional coating, the film becomes brittle and is dissolved in the salt water test. On the other hand, if pores that penetrate the uppermost layer and reach the functional layer are formed in the dense and hard $SiO_2$ containing layer, salt water resistance and photocatalytic function are compatible with each other, and both are improved.

The method of producing a dielectric film of the present invention is characterized in that the method includes a step of forming at least one low refractive index layer as the dielectric film, and a step of forming a layer containing $SiO_2$ and an element selected from the group consisting of sodium, calcium, potassium, and magnesium as the uppermost layer of the dielectric film.

Further, from the viewpoint of salt water resistance and the effect of self-cleaning, it is preferable to have a step of forming a functional layer mainly containing a metal oxide having a photocatalytic function on the transparent substrate side of the uppermost layer, and a step of forming a plurality of pores partially exposing the surface of the functional layer in the uppermost layer.

Further, when the dielectric film is produced, the step of forming the film by ion assisted deposition or sputtering is a preferable embodiment from the viewpoint of forming the uppermost layer as a high density film and improving salt water resistance and scratch resistance.

The dielectric film of the present invention is suitably provided in an optical member, and it is preferable that the optical member is an in-vehicle lens. Hereinafter, the present invention, its constituent elements, and configurations and embodiments for carrying out the present invention will be described in detail. In the present description, when two figures are used to indicate a range of value before and after "to", these figures are included in the range as a lowest limit value and an upper limit value.

«Outline of the Dielectric Multilayer Film of the Present Invention»

The dielectric film of the present invention is a dielectric film provided on a transparent substrate, the dielectric film has at least one low refractive index layer, and the uppermost layer of the dielectric film contains $SiO_2$. The uppermost layer is a layer having a film density of 92% or more, and the uppermost layer contains an element having an electronegativity smaller than Si.

The element having the electronegativity smaller than Si is preferably an element selected from the group consisting of sodium, calcium, potassium and magnesium, and the content thereof is preferably within a range of 0.5 to 10% by mass, and more preferably within a range of 1.0 to 5.0% by mass.

Further, it is preferable that the film density of the uppermost layer is 98% or more.

Here, the "low refractive index layer" refers to a layer having a refractive index of less than 1.7 at the d line. The high refractive index layer refers to a layer having a refractive index of 1.7 or more at the d line. The substrate is an optical member made of resin or glass and may have any shape. The transmittance at a light wavelength of 550 nm is preferably 90% or more.

According to this configuration, since the film density of the uppermost layer of the dielectric film is high, the dielectric film is excellent in the salt water resistance and scratch resistance of the surface, and the hydrophilicity of the surface may be maintained by containing the specific element, so that it is possible to provide a dielectric film capable of maintaining a low water contact angle for a long period of time in a high-temperature and high-humidity environment.

(Composition Analysis of the Uppermost Layer)

The composition analysis of the uppermost layer may be measured by using an X-ray photoelectron spectrometer (XPS) apparatus described below.

(XPS Composition Analysis)

Apparatus name: X-ray photoelectron spectrometer (XPS)
Equipment type: Quantera SXM
Equipment manufacturer: ULVAC-PHI, Inc.
Measuring conditions: X-ray Source; Monochromatized Al Kα ray 25W-15 kV
Vacuum level: $5.0 \times 10^{-8}$ Pa Depth direction analysis is performed by argon ion etching. MultiPak made by ULVAC-PHI is used for data-processing.

《Measuring Method of Film Density》

Here, in the present invention, "film density" means a space filling density, and is defined as a value p represented by the following Formula (1).

Space packing density $p$=(Volume of solid part of film)/(Total volume of film)　　Formula (1):

Here, the total volume of the film is the sum of the volume of the solid portion of the film and the volume of the micropore portion of the film.

By setting the film density of the uppermost layer of the dielectric multilayer film of the present invention to 92% or more, the resistance to salt water may be further improved. The film density may be measured by the following method, and the film density is more preferably in the range of 98% to 100%.

(i) Only a layer containing $SiO_2$ and any one of sodium, calcium, potassium, and magnesium (corresponding to the uppermost layer of the present invention) is formed on a substrate made of white glass BK7 (made by SCHOTT AG (gyp (diameter)=30 mm, t (thickness)=2 mm), and the optical reflectance of the uppermost layer is measured. On the other hand, (ii) theoretical values of optical reflectance of a layer made of the same materials as the uppermost layer are calculated by thin film calculating software "Essential Macleod" (made by SIGMAKOKI Co., Ltd.). Then, the film density of the uppermost layer is specified by comparing the theoretical value of the optical reflectance calculated in (ii) with the optical reflectance measured in (i).

《Measuring Method of Water Contact Angle》

By leaving the sample in an environment of high-temperature and high-humidity (85° C. and 85% RH) for a long time, the time during which the water contact angle according to the following measurement can be maintained at 30° or less is measured. When it is 400 hours or more, it is determined that there is durability against hydrophilicity, and when it is 1000 hours or more, it is determined that durability against hydrophilicity is extremely excellent. Incidentally, when the water contact angle is 15° or less at the time of storage for 1000 hours, it is determined that "super-hydrophilic" may be maintained for a long period of time.

As a method of measuring the contact angle, a known method may be used. For example, the contact angle between a standard liquid (pure water is preferable) and the uppermost layer surface is measured according to the method defined in JIS R3257. The measurement conditions are as follows: temperature 23±5° C., humidity 50±10%, droplet volume of standard liquid 1 to 10 μL, and time from dropping of standard liquid to contact angle measurement within 1 minute. As a specific operation procedure, at a temperature of 23° C., pure water as the standard liquid is dropped on a sample by about 10 μL, and 5 locations on the sample are measured by G-1 apparatus made by Elmer Co., Ltd., and an average contact angle is obtained from an average of the measured values. The time until the contact angle measurement is completed is within 1 minute after dropping the standard liquid.

Hereinafter, FIG. 1 is a cross-sectional view showing an example of the structure of the dielectric film of the present invention.

The layer configuration of the dielectric film of the present invention may be a single layer (in this case, also referred to as a single film) or a plurality of layers (in this case, also referred to as a dielectric multilayer film or a multilayer film).

FIG. 1 shows an embodiment of a "dielectric multilayer film" having a plurality of layers, but the number of layers of the low refractive index layer and the high refractive index layer is one example and is not limited thereto. Further, as described above, from the viewpoint of expressing the effect of the present invention, the low refractive index layer or the uppermost layer according to the present invention also includes a case where the layer has a single layer configuration.

The dielectric film 100 having an antireflection function includes, for example, high refractive index layers 103 and 105a having a refractive index higher than that of a glass substrate 101 constituting a lens, and low refractive index layers 102 and 104 having a refractive index lower than that of the high refractive index layers. It is preferable to have a multilayer structure in which the high refractive index layers and the low refractive index layers are alternately stacked. It is preferable that the dielectric film of the present invention has an average optical reflectance of 2% or less with respect to light incident from the normal direction in the light wavelength range of 420 to 680 nm, from the viewpoint of improving the visibility of images captured as an in-vehicle lens. In the present invention, the dielectric film 100 is also referred to as an optical member.

The uppermost layer 106 according to the present invention is a layer containing $SiO_2$, and the uppermost layer contains an element having an electronegativity smaller than Si. It is preferable that the element having the electronegativity smaller than Si is an element of any one of sodium, calcium, potassium and magnesium. The refractive index of the uppermost layer with respect to the light wavelength of 587.56 nm is 1.6 or less, which is a preferable range of the refractive index because the optical reflectance of the lower layer is not changed as the light reflection layer.

In FIG. 1, a functional layer 105b mainly composed of a metal oxide having a photocatalytic function may be disposed on the substrate side of the uppermost layer 106, from the viewpoint of self-cleaning the stain adhering to the uppermost layer by the photocatalytic function. By providing the functional layer 105b adjacent to the uppermost layer 106, for example, a photocatalytic function may be effectively exhibited, and by using a metal oxide having a photocatalytic effect and a photoactive effect, an organic substance on the surface may be removed and contributes to maintaining the hydrophilicity of the uppermost layer 106, which is a preferable aspect.

The function of the uppermost layer is a low index layer and is preferably $SiO_2$ as the main component. Here, the "main component" means that 51% by mass or more of the total mass of the uppermost layer is $SiO_2$, preferably 70% by mass or more, particularly preferably 90% by mass or more.

However, it is also preferred to contain other metal oxide, and it is also preferred from the viewpoint of optical reflectance to be a mixture of $SiO_2$ and a part of $Al_2O_3$ or $MgF_2$.

The functional layer 105b is preferably a layer that contains $TiO_2$ having a photocatalytic function as described later, and may be disposed as an alternative layer to the high refractive index layer 105a in view of the refractive index.

In the dielectric film of the present invention shown in FIG. 1, the low refractive index layer, the high refractive index layer, and the uppermost layer 106 according to the present invention are laminated on the substrate 101 to constitute a dielectric film, but the uppermost layer according to the present invention may be formed on both sides of the substrate 101. In other words, although it is preferable that the uppermost layer according to the present invention is on the side exposed to the external environment, the uppermost layer according to the present invention may not be formed on the side to be exposed but, for example, in order to prevent the influence of the internal environment, the uppermost layer of the present invention may be formed even on the inner side opposite to the side to be exposed. In addition, the optical member of the present invention may be applied to an optical member such as an antireflection member or a heat shielding member in addition to the lens.

[1] Constitution of Dielectric Film and Production Method

The dielectric film having an antireflection function has a high refractive index layer having a refractive index higher than that of the substrate, and a low refractive index layer having a refractive index lower than that of the high refractive index layer. It is preferable to have a multilayer structure in which the high refractive index layers and the low refractive index layers are alternately stacked. The number of layers is not particularly limited, but is preferably 12 or less from the viewpoint of maintaining high productivity and obtaining an antireflection layer. That is, although the number of layers depends on the required optical performance, by laminating approximately 3 to 8 layers, it is possible to reduce the reflectivity of the entire visible range, and it is preferable that the upper limit number is 12 layers or less, in that it is possible to prevent the film from being peeled off due to an increase in the stress of the film.

As materials used for the dielectric film, for example, oxides such as Ti, Ta, Nb, Zr, Ce, La, Al, Si, and Hf, or an oxide compound in combination thereof and $MgF_2$ are suitable. Further, by stacking a plurality of layers of different dielectric materials, it is possible to add a function of reducing the reflectivity of the entire visible range.

The low refractive index layer is made of a material having a refractive index smaller than 1.7, and is a layer containing $SiO_2$. However, it is also preferred to contain other metal oxide, and it is also preferred from the viewpoint of optical reflectance to be a mixture of $SiO_2$ and a part of $Al_2O_3$.

The high refractive index layer is composed of a material having a refractive index of 1.7 or more, and is preferably, for example, a mixture of an oxide of Ta and an oxide of Ti, or otherwise, an oxide of Ti, an oxide of Ta, or a mixture of an oxide of La and an oxide of Ti. In the present invention, it is preferably $Ta_2O_5$ or $TiO_2$, and more preferably $Ta_2O_5$.

The total thickness of the dielectric film is preferably in the range of 50 nm to 5 μm. When the thickness is 50 nm or more, it is possible to exhibit the antireflection optical characteristic, and when the thickness is 5 μm or less, it is possible to prevent the occurrence of the surface deformation due to the film stress of the multilayer film itself.

As a method of forming a thin film of metal oxide on a substrate, it is known a deposition system such as a vacuum deposition method, an ion beam deposition method, or an ion plating method, and a sputtering system such as a sputtering method, an ion beam sputtering method, or a magnetron sputtering method. As a film forming method for forming a dielectric film of the present invention, it is preferable to use an ion assisted deposition method (hereinafter, also referred to as IAD in the present invention) or a sputtering method. In particular, it is preferable to form a high density film as the uppermost layer by using an ion assisted deposition method.

The other layers of the dielectric film are formed by vapor deposition, and any one of the layers is preferably formed by IAD. The scratch resistance of the entire dielectric film may be further improved by the film formation with IAD.

In particular, the uppermost layer 106 is formed by an IAD method or a sputtering method, so that the film density may be increased.

The film density of the uppermost layer 106 is preferably 92% or more, and more preferably 98% or more. Here, the film density means the space filling density as described above. By setting the film density of the uppermost layer 106 in the range of 98 to 100%, salt water resistance and scratch resistance may be further improved.

IAD is a method of forming a dense film by applying high kinetic energy of ions during film formation or increasing the adhesion of the film, and for example, an ion beam method is a method of accelerating a deposition material by ionized gas molecules irradiated from an ion source and forming a film on a substrate surface.

Figure 2:
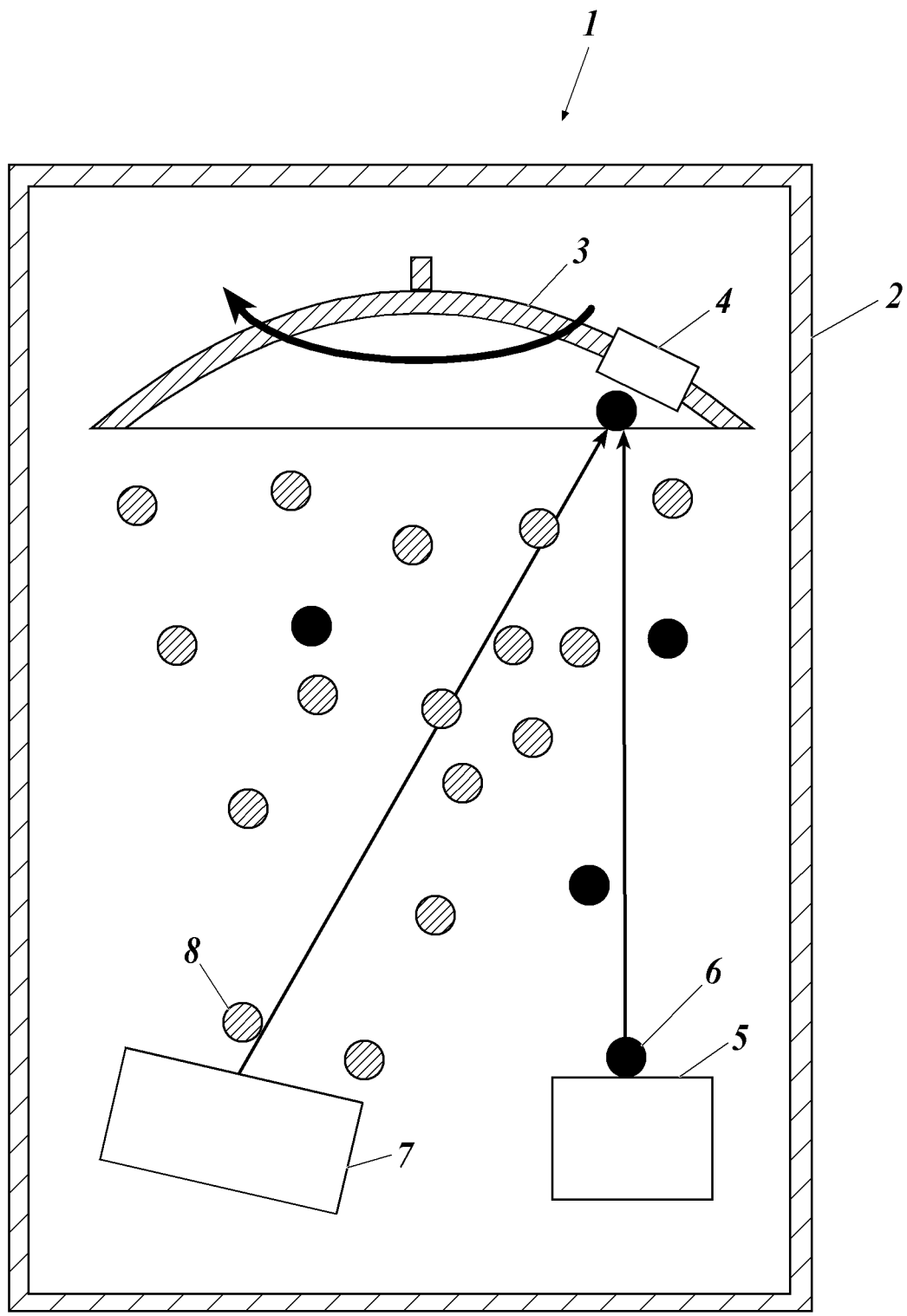
FIG. 2 is a schematic diagram of a vacuum evaporation apparatus used for IAD.

FIG. 2 is a schematic diagram showing an example of a vacuum evaporation apparatus using IAD.

A vacuum evaporation apparatus 1 using IAD (hereinafter referred to as an IAD evaporation apparatus in the present invention) includes a dome 3 in a chamber 2, and a substrate 4 is disposed along the dome 3. The vapor deposition source 5 includes an electron gun or a resistive heating apparatus for evaporating the vapor deposition material, and the vapor deposition material 6 scatters from the vapor deposition source 5 toward the substrate 4, and condenses and solidifies on the substrate 4. At this time, an ion beam 8 is irradiated from an IAD ion source 7 toward the substrate, and high kinetic energy of ions is applied during the film formation to form a dense film or increase the adhesion of the film.

Here, the substrate 4 used in the present invention includes glass and resins such as a polycarbonate resin and a cycloolefin resin, and is preferably an in-vehicle lens.

A plurality of deposition sources 5 may be disposed at the bottom of the chamber 2. Here shows one deposition source as the deposition source 5, the number of the deposition source 5 may be a plurality. A deposition material of the deposition source 5 is generated by an electron gun as a deposition material 6, and the deposition material is scattered and adhered to a substrate 4 (e.g., lens) installed in the chamber 2, whereby a layer of the deposition material (e.g., a low refractive index material such as $SiO_2$, $MgF_2$, or $Al_2O_3$, a high refractive index material, $Ta_2O_5$ or $TiO_2$) is formed on the substrate 4.

When the uppermost layer of the present invention is formed, a $SiO_2$ target and a target which contains any one of sodium, calcium, potassium and magnesium is disposed in the deposition source 5, and the vapor deposition material 6 in which these materials are mixed may be generated and used. Further, it is possible to use a target mixed with $SiO_2$ and the above-described element. In order to improve the accuracy of the composition of the uppermost layer, it is preferable to use the latter mixed target.

It is preferable to use $Na_2O$ as sodium, CaO as calcium, $K_2O$ as potassium, and MgO as magnesium, all of which may be obtained from Merck & Co.

The chamber 2 is provided with a vacuum evacuation system (not shown), by which the interior of the chamber 2 is evacuated. The degree of decompression in the chamber typically ranges from $1\times10^{-4}$ to 1 Pa, preferably $1\times10^{-3}$ to $1\times10^{-2}$ Pa.

The dome 3 holds at least one holder (not shown) for holding the substrate 4, and is also called an evaporation umbrella. The dome 3 has a circular arc-shaped cross section, passes through the center of the chord connecting both ends of the arc, and has a rotationally symmetrical shape to rotate the axis perpendicular to the chord as an axis of rotation symmetry. When the dome 3 rotates about the axis at a constant speed, for example, the substrate 4 held by the dome 3 via the holder revolves around the axis at a constant speed.

The dome 3 may hold a plurality of holders side by side in the radial direction of rotation (revolution radial direction) and the direction of rotation (revolution direction). Thus, it is possible to simultaneously form a film on a plurality of substrates 4 held by a plurality of holders, it is possible to improve the production efficiency of the element.

The IAD ion source 7 is an instrument for introducing argon or oxygen gas into the body to ionize them, and irradiating the ionized gas molecules (ion beam 8) toward the substrate 4. As the ion source, a Kaufman type (filament), a hollow cathode type, an RF type, a bucket type, or a Duoplasmatron type may be used. By irradiating the substrate 4 with the above gas molecules from the IAD ion source 7, for example, molecules of a film forming material which evaporate from a plurality of evaporation sources may be pressed against the substrate 4, and a film having high adhesion and denseness may be formed on the substrate 4. The IAD ion source 7 is installed so as to face the substrate 4 at the bottom of the chamber 2, it may be installed at a position offset from the opposing axis.

The ion beam used in IAD is used at low vacuum and the acceleration voltage tends to be lower than the ion beam used in the ion beam sputtering method. For example, an ion beam having an acceleration voltage of 100 to 2000 V, an ion beam having a current density of 1 to 120 $\mu A/cm^2$, or an ion beam having an acceleration voltage of 500 to 1500 V and a current density of 1 to 120 $\mu A/cm^2$ may be used. In the film forming process, the ion-beam delivery time may be, for example, 1 to 800 seconds, and the ion-beam delivery number may be, for example, $1\times10^{13}$ to $5\times10^{17}$ number/$cm^2$. The ion beam used in the film formation step may be an ion beam of oxygen, an ion beam of argon, or an ion beam of a mixed gas of oxygen and argon. For example, it is preferable that the oxygen introduction amount is within a range of 30 to 60 sccm and the argon introduction amount is within a range of 0 to 10 sccm. "SCCM" is an abbreviation of standard cc/min and is a unit indicating the number of cc flow per minute at 1 pressure (atmospheric pressure $10^{13}$ hPa) and 0° C.

The monitoring system (not shown) is a system that monitors the wavelength characteristics of the layer formed on the substrate 4 by monitoring the layer that evaporates from each vapor deposition source 5 and adheres to itself during vacuum film formation. With this monitoring system, it is possible to grasp the optical properties of the layer to be deposited on the substrate 4 (e.g., spectral transmittance, optical reflectance, and optical layer thickness). The monitoring system also includes a quartz layer thickness monitor, which can monitor the physical layer thickness of the layer deposited on the substrate 4. The monitoring system also functions as a control unit for controlling the switching of ON/OFF of the plurality of evaporation sources 5 or the switching of ON/OFF of the IAD ion source 7 according to the monitoring result of the layer.

As the deposition by the sputtering method, two-pole sputtering, magnetron sputtering, dual magnetron sputtering using an intermediate frequency region (DMS), ion beam sputtering, or ECR sputtering may be used alone or in combination of two or more. Further, the application method of the target is appropriately selected according to the target species, and any one of DC (Direct Current) sputtering and RF (high frequency) sputtering may be used.

Sputtering method may be multiple simultaneous sputtering using a plurality of sputtering targets. Regarding the method for producing these sputtering targets and the method for producing a thin film using these sputtering targets, for example, JP-A 2000-160331, JP-A 2004-068109, and JP-A 2013-047361 may be referred to as appropriate.

When $SiO_2$ is used as a main component for the uppermost layer 106, heat treatment is performed at 200° C. or more for 2 hours after film formation, so that salt water resistance and scratch resistance are further improved, which is preferable.

In the dielectric film of the present invention, it is preferable to use a layer containing $TiO_2$ as a photocatalyst layer having a self-cleaning function as a layer directly below the uppermost layer 106. The self-cleaning function of $TiO_2$ refers to the effect of decomposing organic matter by the photocatalyst. In this method, when $TiO_2$ is irradiated with ultraviolet light, after electronics are emitted, OH radicals are generated, and the organic matter is decomposed by the strong oxidizing power of the OH radicals. By adding $TiO_2$ containing layer to the dielectric film of the present invention, it is possible to prevent organic matter adhering to the optical member from contaminating the optical system. In this case, it is preferable that $SiO_2$ containing layer of the upper layer has a slightly rough film quality because OH radicals easily move and the antifouling property of the surfaces of the optical members may be improved. It is possible to control the film quality by controlling the IAD-condition when forming the upper $SiO_2$ containing layer. Further, it is possible to form the uppermost layer 106 as a dense film and to form pores such that the functional layer 105b is partially exposed in the uppermost layer 106, so that the OH radical is more easily transferred and the effect of the photocatalytic effect is easily exhibited, and further, it is possible to provide a salt water resistance.

The dielectric film 100 of the present invention preferably satisfies the following conditional expressions.

10 nm≤TL≤350 nm            Conditional expression (1):

50 nm≤Tcat≤700 nm            Conditional expression (2):

Here, TL represents the film thickness of the uppermost layer 106. Tcat represents the film thickness of the high refractive index layer 105a or the functional layer 105b adjoining the uppermost layer 106.

When the value of the conditional expression (1) is equal to or less than the upper limit, the photocatalytic effect may be exhibited by taking in the excited active oxygen by UV light through the plurality of pores 30 provided in the uppermost layer 106.

On the other hand, when the value of the conditional expression (1) is equal to or more than the lower limit, the hydrophilic function of the topmost layer 106 may be easily maintained, and a strong uppermost film may be formed, so that sufficient salt water resistance and scratch resistance are ensured. It is preferable that the dielectric film 100 satisfies the following conditional expression (1b).

$$60 \text{ nm} \leq TL \leq 250 \text{ nm} \quad \text{Conditional expression (1b):}$$

When the value of the conditional expression (2) is equal to or more than the lower limit, a sufficient photocatalytic effect may be expected because the film thickness of the functional layer 105b is secured. On the other hand, as the thickness of the functional layer 105b increases, the photocatalytic effect may be expected, but instead, it becomes difficult to obtain the desired spectral characteristic required for the multilayer film, so that the value of the conditional expression (2) is preferably set to an upper limit or less. Note that it is preferable that the functional layer 105b satisfies the following conditional expression (2b).

$$50 \text{ nm} \leq Tcat \leq 600 \text{ nm} \quad \text{Conditional expression (2b):}$$

The functional layer 105b adjacent to the uppermost layer 106 is formed of an oxide containing Ti as a main component (for example, $TiO_2$). Ti oxides such as $TiO_2$ have very high photocatalytic effect. In particular, anatase-type $TiO_2$ is preferable as a material for the functional layer 105b because it has a high photocatalytic effect.

The uppermost layer 106 is formed primarily of $SiO_2$, for example. In the uppermost layer 106, $SiO_2$ is preferably contained in an amount of 90% or more. The UV-light is hardly incident at night or outdoors, and the hydrophilic effect is lowered in the case of the oxide containing Ti as a main component, but even in such a case, the hydrophilic effect may be exhibited by forming the uppermost layer 106 from $SiO_2$, and the salt water resistance is further enhanced. Having hydrophilicity means that the contact angle of 10 μL of water droplets on the dielectric film 100 is 30° or less, preferably 15° or less.

In order to further improve scratch resistance, when $SiO_2$ is used for the uppermost layer 106, it is preferable to perform heat treatment at 500° C. for 2 hours after film formation.

The uppermost layer 106 may be formed from a mixture of $SiO_2$ and $Al_2O_3$ (provided that the composition ratio of $SiO_2$ is 90% by mass or more). As a result, it is possible to exhibit a hydrophilic effect even at night or outdoors, and to enhance the scratch resistance by combining $SiO_2$ and $Al_2O_3$. When using a mixture of $SiO_2$ and $Al_2O_3$ in the uppermost layer 106, it is possible to improve scratch resistance by applying a heat treatment at 200° C. or more for 2 hours after film formation.

The dielectric film 100 preferably satisfies the following conditional expression.

$$1.35 \leq NL \leq 1.55 \quad \text{Conditional expression (3):}$$

Here, NL represents the refractive index of the material of the low refractive index layer at the d line.

By satisfying the conditional expression (3), the dielectric film 100 having required optical characteristics may be obtained. Here, the "d line" refers to light having a wavelength of 587.56 nm. As a material of the low index layer, it is possible to use $SiO_2$ having a refractive index of 1.48 at the d line or $MgF_2$ having a refractive index of 1.385 at the d line.

It is preferable that the dielectric film 100 satisfies the following conditional expression.

$$1.6 \leq Ns \leq 2.2 \quad \text{Conditional expression (4):}$$

Here, Ns represents a refractive index of the base material at the d line.

In optical design, by satisfying the conditional expression (4) as the refractive index of the base material at the d line, the optical performance of the dielectric film 100 may be enhanced with a compact configuration. By forming the dielectric film of the present embodiment on the glass base material satisfying the conditional expression (4), it may be used for a lens exposed to the outside world, and it is possible to achieve both excellent environmental resistance performance and optical performance.

It is preferable that a functional layer containing a metal oxide having a photocatalytic function as a main component is disposed in a layer immediately below the uppermost layer according to the present invention, and that the uppermost layer has a plurality of pores for partially exposing the surface of the functional layer.

FIG. 3A to FIG. 3D are a schematic view showing the functional layer and the uppermost layer having pores according to the present invention.

Figure 3A:
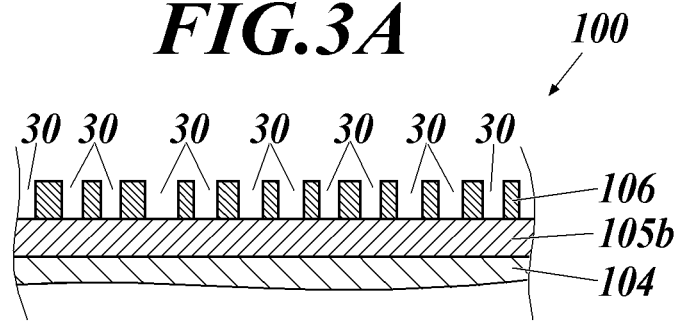
FIG. 3A is a schematic diagram showing a functional layer and an uppermost layer having pores according to the present invention.
Figure 3B:
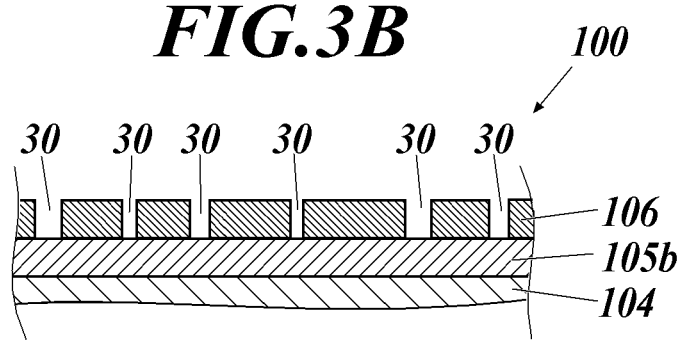
FIG. 3B is a schematic diagram showing a functional layer and an uppermost layer having pores according to the present invention.
Figure 3C:
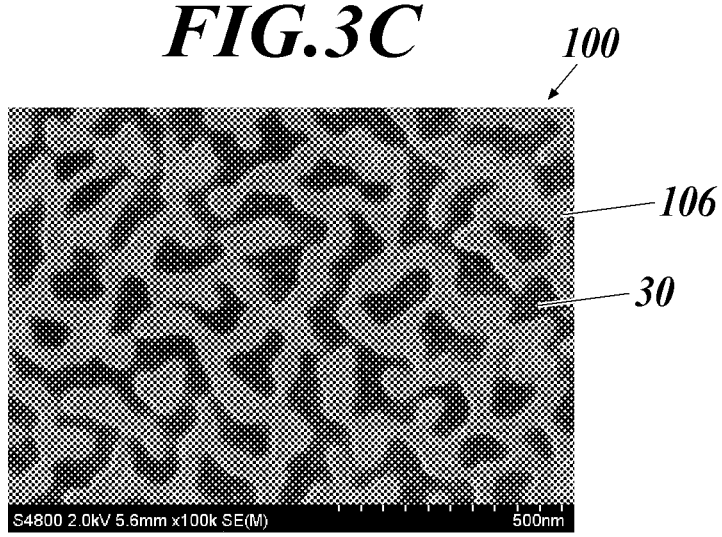
FIG. 3C is a schematic diagram showing a functional layer and an uppermost layer having pores according to the present invention.
Figure 3D:
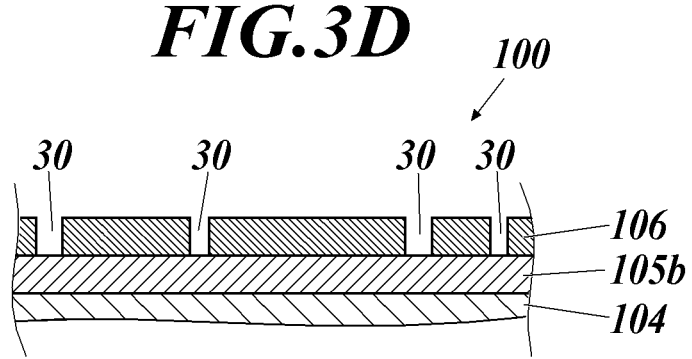
FIG. 3D is a schematic diagram showing a functional layer and an uppermost layer having pores according to the present invention.

FIG. 3A is a diagram schematically showing a cross section of a dielectric film 100 produced by forming a metal mask with particulate pores. FIG. 3B is a diagram schematically showing a cross section of a dielectric film produced by forming a metal mask having leaf vein shaped pores connected to neighboring pores. FIG. 3C is a SEM image of the surface of the uppermost layer of FIG. 3B. FIG. 3D is a diagram schematically showing a cross section of a dielectric film produced by forming a metal mask having porous pores.

As shown in FIG. 3A to FIG. 3D, the uppermost layer 106 has a plurality of pores 30 for expressing a photocatalytic function in the functional layer 105b which is an adjoining high refractive index layer. The pores 30 are formed by dry etching. The ratio of the total area of the cross sections of the plurality of pores 30 to the surface area of the uppermost layer 106 (the total area of the pores 30 when the uppermost layer 106 is viewed from above) (hereinafter, referred to as the pore density or the membrane dropout rate) is preferably about 50% when the pores 30 are formed using, for example, a leaf vein shaped metal mask 50, which will be described later. The cross section of the pores 30 has a shape in which the pores have various sizes and are connected to each other on the network.

Hereinafter, a production method of forming pores in the dielectric film 100 and the uppermost layer will be described with reference to FIG. 4, FIG. 5, FIG. 6, and FIG. 7.

Figure 4:
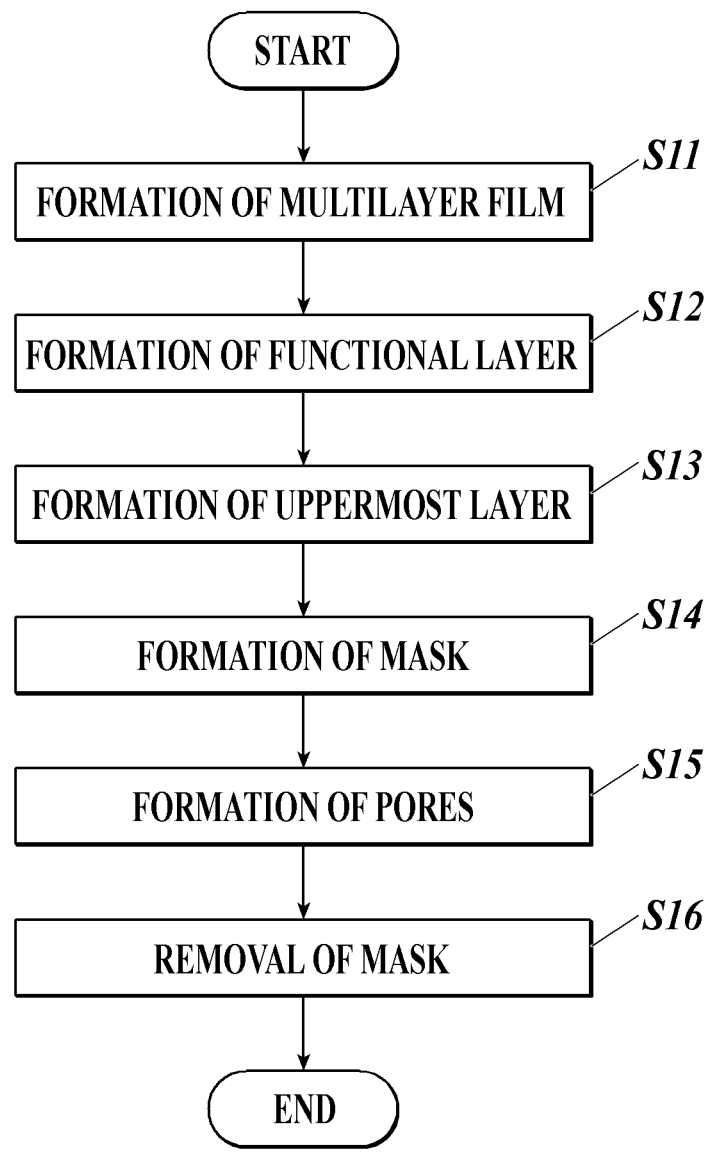
FIG. 4 is a flowchart of a process of forming pores on the uppermost layer surface.

FIG. 4 is a flowchart of a process of forming pores on the uppermost layer surface according to the present invention.

FIG. 5A to FIG. 5E are a conceptual diagram for explaining the step of forming a metal mask in the form of particles to form pores on the uppermost layer according to the present invention.

FIG. 6A to FIG. 6D are a SEM-image of the surface of the uppermost layer according to the present invention in which each metal mask was formed.

Figure 7A:
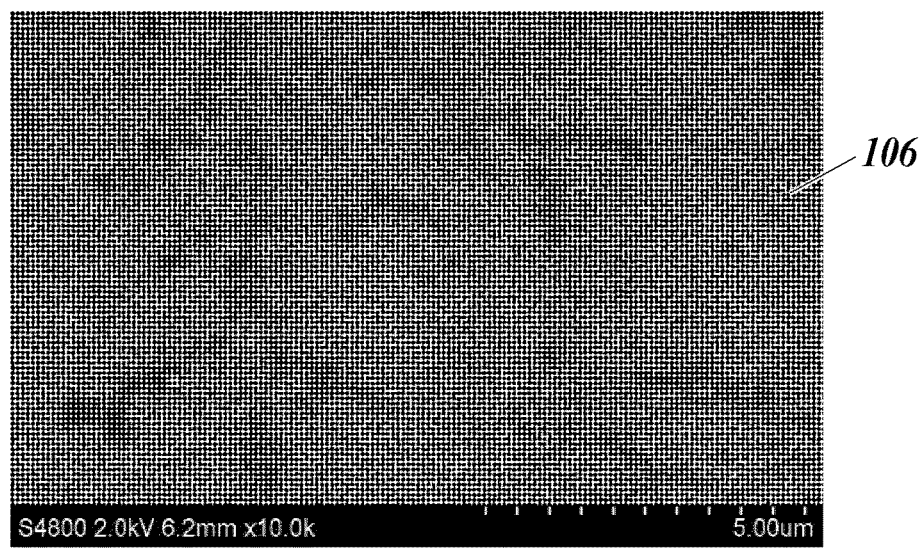
FIG. 7A is a SEM-image and enlarged view of a dielectric film with an uppermost layer processed in leaf vein shape.
Figure 7B:
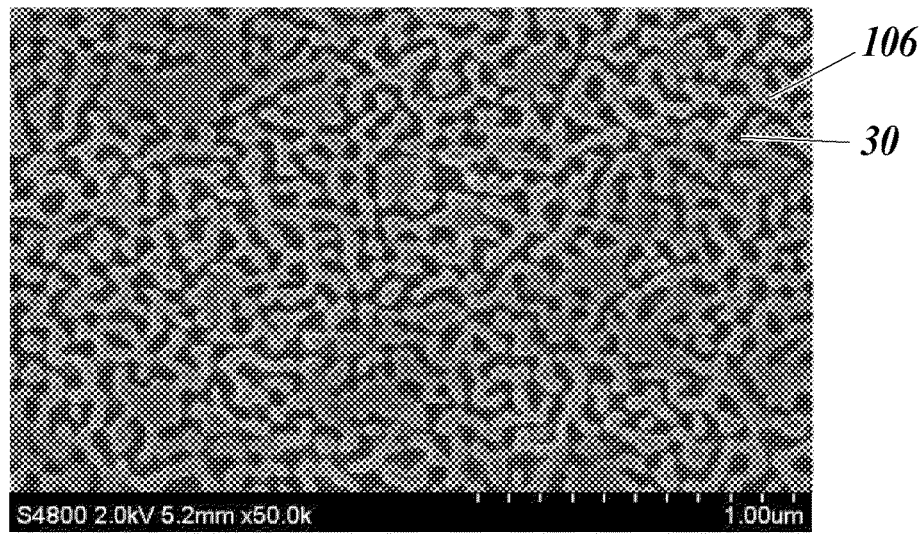
FIG. 7B is a SEM-image and enlarged view of a dielectric film with an uppermost layer processed in leaf vein shape.
Figure 7C:
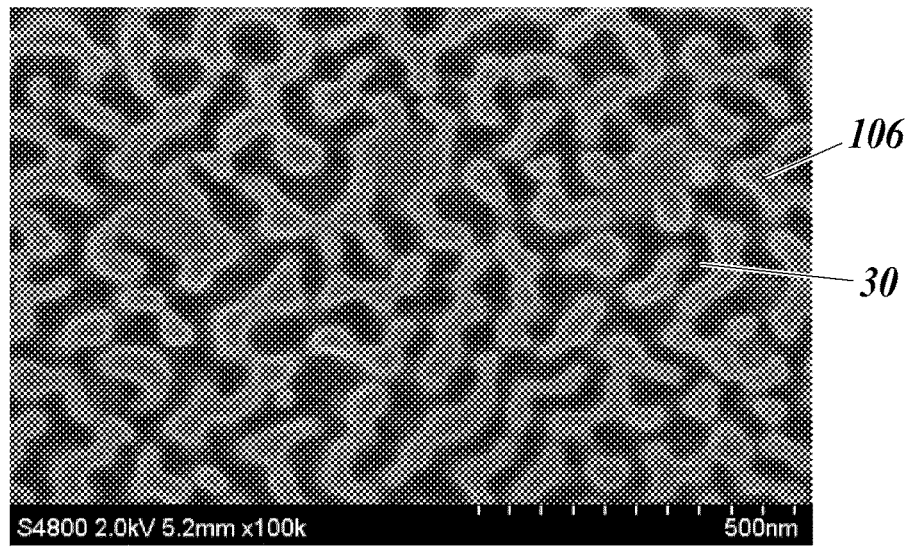
FIG. 7C is a SEM-image and enlarged view of a dielectric film with an uppermost layer processed in leaf vein shape.

FIG. 7A to FIG. 7C are a SEM image and an enlarged view when the surface of the uppermost layer according to the present invention is processed into a leaf vein shape.

First, in FIG. 4, a low refractive index layer and a high refractive index layer as multilayer films are alternately laminated on a base material (substrate) (multilayer film forming step: step S11). However, in step S11, a layer of the multilayer film excluding the uppermost layer 106 and the functional layer 105b is formed. That is, it is formed to a low refractive index layer adjacent to the lower side of the functional layer 105b. The multilayer film is formed by various vapor deposition methods such as IAD or sputtering methods. Note that, depending on the configuration of the dielectric film 100, the formation of the multilayer film in step S11 may be omitted.

Next, the functional layer 105 is formed in step S12, and then the uppermost layer 106 is formed in step S13. The forming method is preferably IAD.

Figure 5A:
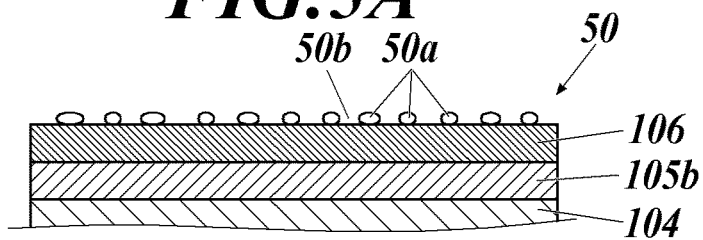
FIG. 5A is a conceptual diagram illustrating a step of forming pores by forming a metal mask in the form of particles.
Figure 5B:
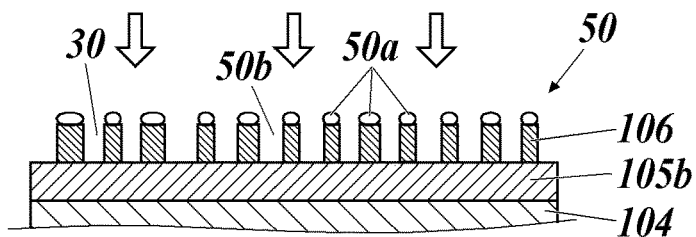
FIG. 5B is a conceptual diagram illustrating a step of forming pores by forming a metal mask in the form of particles.
Figure 5D:
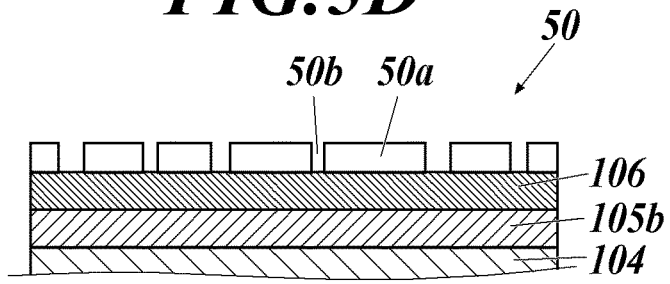
FIG. 5D is a conceptual diagram illustrating a step of forming pores by forming a metal mask in the form of particles.
Figure 5E:
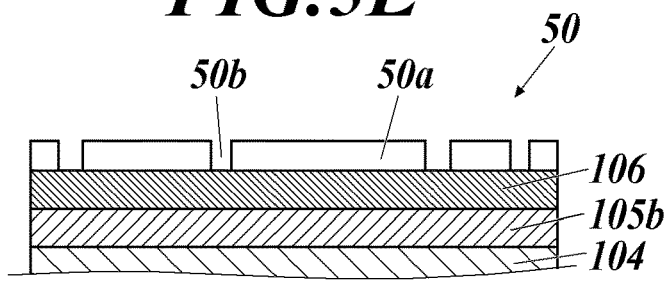
FIG. 5E is a conceptual diagram illustrating a step of forming pores by forming a metal mask in the form of particles.
Figure 6A:
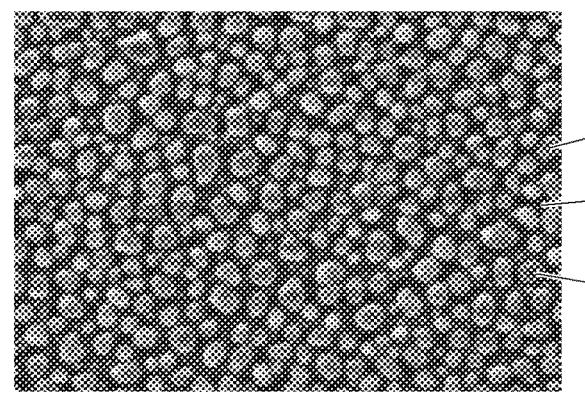
FIG. 6A is a SEM-image of the sample on which a metal mask was formed.
Figure 6B:
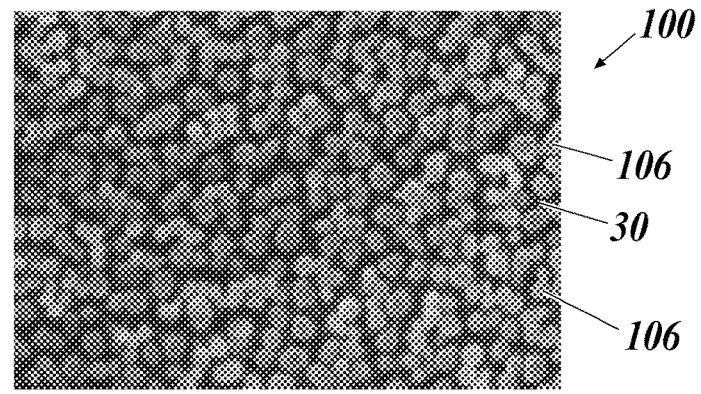
FIG. 6B is a SEM-image of the sample on which a metal mask was formed.
Figure 6C:
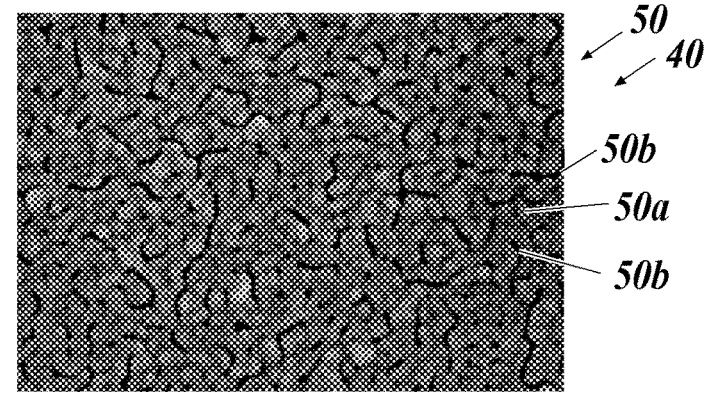
FIG. 6C is a SEM-image of the sample on which a metal mask was formed.
Figure 6D:
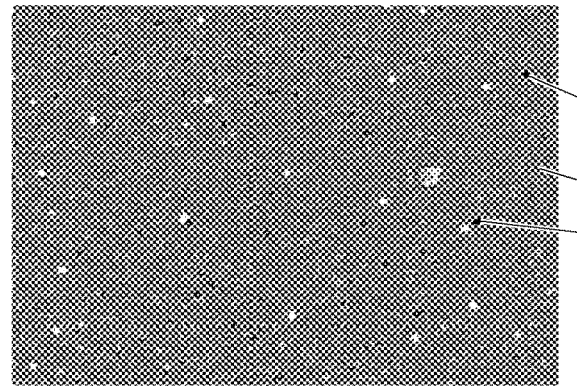
FIG. 6D is a SEM-image of the sample on which a metal mask was formed.

After the uppermost layer forming step, a metal mask 50 is formed on the surface of the uppermost layer 106 (mask forming step: step S14). As shown in FIG. 5A and FIG. 6A, the metal mask 50 is formed in the form of particles on the uppermost layer 106. This allows the nano-sized metal mask 50 to be formed in the uppermost layer 106. Incidentally, as shown in FIG. 5D and FIG. 6C, the metal mask 50 may be formed to have leaf vein shape pores. As shown in FIG. 5E and FIG. 6D, the metal mask 50 may be formed to have porous pores. The porous state is a state in which a plurality of fine pores are present, for example, a state in which a plurality of pores having a diameter of about several tens of nm in terms of a projected area are formed.

The metal mask 50 includes a metal portion 50a and an exposed portion 50b. The film thickness of the metal mask 50 is in the range of 1 to 30 nm. Depending on the film forming conditions, for example, when forming the metal mask 50 so that the film thickness is 2 nm using a vapor deposition method, the metal mask 50 is likely to be in the form of particles (FIG. 6A). In addition, for example, when the metal mask 50 is formed to have a thickness of 12 nm to 15 nm by using an evaporation method, the metal mask 50 tends to have a leaf vein shape (FIG. 6C). Furthermore, for example, when deposited so that the film thickness is 10 nm using a sputtering method, the metal mask 50 is likely to be porous (FIG. 6D). By forming a thin film of metal in the above-mentioned range of thickness, it is possible to easily form an optimal metal mask 50 in the form of particles, veins, or pores. The metal mask 50 is formed of, for example, Ag or Al.

Next, a plurality of pores 30 are formed in the uppermost layer 106 (pore forming step: step S15). As shown in FIG. 5B and FIG. 6B, a dry etching using an etching apparatus (not shown) is employed for the etching. Alternatively, a film forming apparatus used for forming the multilayer film or the metal mask 50 may be used. In the pore forming step, a plurality of pores are formed by using materials of the uppermost layer 106, specifically gases that react with $SiO_2$. In this case, it is possible to scrape $SiO_2$ of the uppermost layer 106 without damaging the metal mask 50. As the etching gas, for example, $CHF_3$, $CF_4$, $COF_2$ and $SF_6$ are used. As a result, a plurality of pores 30 exposing the surface of the functional layer 105b are formed in the uppermost layer 106. That is, the uppermost layer 106 corresponding to the exposed portion 50b of the metal mask 50 is etched to form the pores 30, the surface of the partially functional layer 105b becomes a state of being exposed.

Figure 5C:
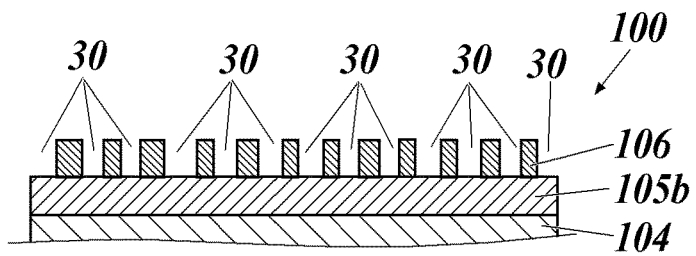
FIG. 5C is a conceptual diagram illustrating a step of forming pores by forming a metal mask in the form of particles.

After the pore forming step, the metal mask 50 is removed as shown in FIG. 5C (mask removing step: step S16). Specifically, the metal mask 50 is removed by wet etching using acetic acid. The metal mask 50 may be removed by dry etching using Ar or $O_2$ as etching gases, for example. If the etching of the metal mask 50 is performed using dry etching, it is possible to perform a series of steps from the formation of the multilayer film MC to the etching of the metal mask 50 in the same film forming apparatus.

Through the above step, the dielectric film 100 having the plurality of pores 30 in the uppermost layer 106 may be obtained.

According to the method for producing the dielectric film, after the uppermost layer 106 is formed, a plurality of pores 30 for expressing the photocatalytic function are formed in the functional layer 105b, whereby the superhydrophilicity and the photocatalytic function may be made compatible. The pores 30 have a size such that the functional layer 105b exhibits a photocatalytic function, and are not visually recognized by the user, and also have salt water resistance.

Although the functional layer 105b exhibits a photocatalytic function, since it is a high refractive index layer, it is necessary to provide the uppermost layer 106, which is a low refractive index layer, on the functional layer 105b in order to maintain the antireflection characteristic of the dielectric film 100. Therefore, when the density of the uppermost layer 106 is high, there is a problem that the photocatalytic function of the functional layer 105b is not developed. On the other hand, when the film density of the uppermost layer 106 is lowered, there is a problem that the salt water resistance and the scratch resistance of the uppermost layer 106 become low. By providing a plurality of pores 30 in the uppermost layer 106 as in the dielectric film 100 according to the present embodiment, the photocatalytic function of the functional layer 105b may be exhibited while maintaining antireflection characteristics, hydrophilicity, salt water resistance, and scratch resistance.

As described above, the dielectric film 100 has a multilayer film having antireflection characteristics and excellent salt water resistance and scratch resistance, and exhibits superhydrophilicity and photocatalytic effect, and is suitably used for an in-vehicle lens, a communication lens, or a building material, and is particularly suitable as an in-vehicle lens.

EXAMPLES

Hereinafter, the present invention will be specifically described with reference to Examples, but the present invention is not limited thereto. In Examples, "parts" or "%" is used, but unless otherwise specified, it represents "parts by mass" or "% by mass".

Example 1

In order to evaluate the uppermost layer equipped in the dielectric film of the present invention, a single film described in Table I was prepared and evaluated.

<Preparation of Single Film 1>

On a glass base material TAFD5G (made by HOYA Corporation, refractive index of 1.835), mixed particles of $SiO_2$ and $Na_2O$ (trade name: $SiO_2$—$Na_2O$, made by Toshima Manufacturing Co., Ltd.) in a mass ratio of 95:5 were prepared for the uppermost layer of the present invention, and the following deposition was performed.

The above-mentioned base material was installed in a vacuum evaporation apparatus, the above-mentioned film-forming material was loaded into a first evaporation source, and was evaporated at a film forming rate of 3 Å/sec by IAD, so that the sodium content became 5% by mass, whereby a single film 1 having a thickness of 100 nm was prepared on the base material.

Film Forming Conditions (Chamber Conditions)
Heating temperature: 370° C.
Starting vacuum level: 1.33×10' Pa
(Evaporation Source of a Film Forming Material)
Electron gun The IAD was done by using an apparatus of RF ion source "OIS One" made by Optomn Co. at an acceleration voltage of 1200 V, an acceleration current of 1000 mA, and a neutralization current of 1500 mA. Introduction of the IAD gases was carried out under the conditions of 50 sccm of $O_2$, 10 sccm of Ar gas, and 50 sccm of neutral gas $O_2$.

The composition analysis of the uppermost layer was measured using an X-ray photoelectron spectrometer (XPS) apparatus described in the following.

(XPS Composition Analysis)
Apparatus name: X-ray photoelectron spectrometer (XPS)
Equipment type: Quantera SXM
Equipment manufacturer: ULVAC-PHI, Inc.
Measuring conditions: X-ray source; Monochromatized Al Kα ray 25W-15 kV
Vacuum level: $5.0\times10^{-8}$ Pa Depth direction analysis was performed by argon ion etching. MultiPak made by ULVAC-PHI was used for data-processing.

<Preparation of Single Films 2 to 9>

The formulation of film formation is as shown in Table I, but in the preparation of the single film 1, the sodium content was changed by changing vapor deposition conditions of $Na_2O$, and the uppermost layer according to the present invention containing potassium, calcium, iron and magnesium produced by $K_2O$, $CaO$, $Fe_2O_3$ and $MgO$ (all made by Merck & Co.) was vapor-deposited by IAD to form single films 2 to 9.

In the preparation of the single film 8, a film was formed in the same manner as in the preparation of the single film 1 except that heating at 370° C. was not performed at the time of deposition by IAD to obtain a single film 8.

<Preparation of Single Film 10>

In the preparation of the single film 1, a single film 10 was obtained in the same manner except that $Na_2O$, $K_2O$ and CaO were mixed in a mass ratio of 1:1:1 as film formation materials so that the total content was 5% by mass.

<Preparation of a Single Film 11>

In the preparation of the single film 1, a single film 11 was obtained in the same manner except that a film was formed by a sputtering method.

As the sputtering apparatus, a magnetron sputtering apparatus EB1100 (made by Canon Anelva Corporation) was used.

Ar and $O_2$ were used as the process gases, and a film was formed by the RF method using the above-described magnetron sputtering apparatus. The sputtering power supply power was 5.0 W/cm², and the deposition pressure was 0.4 Pa. Further, the oxygen partial pressure was appropriately adjusted. After collecting data in advance on the change in layer thickness with respect to the film formation time and calculating the layer thickness to be formed per unit time, the film formation time was set so as to be a predetermined layer thickness.

<Single Film 12: Preparation of Dielectric Multilayer Film 1>

On a glass base material TAFDSG (made by HOYA Corporation, refractive index of 1.835), a low refractive index layer using $SiO_2$ (made by Merck & Co.) and a high refractive index layer using OA600 (mixture of $Ta_2O_5$, TiO, and $Ti_2O_5$, made by Canon Optron, Inc.) were stacked with a predetermined film thickness using IAD to layer number 1 to 4 in Table I below. Next, as the uppermost layer (layer number 5) similar to the single film 1 of Example 1, particles were prepared by mixing $SiO_2$ and $Na_2O$ (product name: $SiO_2$—$Na_2O$, made by Toshima Manufacturing Co., Ltd.) in a mass ratio of 95:5.

The base material described above was installed in a vacuum deposition apparatus, the film forming material was loaded to the third evaporation source, and deposited at a deposition rate 3 Å/sec, thus an uppermost layer (layer number 5) having a thickness of 88 nm was formed on the functional layer. The formation of the functional layer was similarly performed by IAD, with 370° C. heating conditions.

<Film Forming Conditions>
(Chamber Conditions)
Heating temperature: 370° C.
Starting vacuum level: $1.33\times10^{-3}$ Pa
(Evaporation Source of a Film Forming Material)
Electron gun
(Formation of a Low Refractive Index Layer and a High Refractive Index Layer)

Film forming material for low refractive index layer: $SiO_2$ (product name: $SiO_2$, made by Merck & Co.)

The above-mentioned base material was installed in an IAD vacuum evaporation apparatus, and the first evaporation source was charged with the above-mentioned film forming material, followed by evaporation at a film forming rate of 3 Å/sec to form a low refractive index layer having a thickness of 31.7 nm on the base material.

The IAD was done by using an apparatus of RF ion source "OIS One" made by Optomn Co. at an acceleration voltage of 1200 V, an acceleration current of 1000 mA, and a neutralization current of 1500 mA. Introduction of the IAD gases was carried out under the conditions of 50 sccm of $O_2$, 10 sccm of Ar gas, and 50 sccm of neutral gas $O_2$.

Film forming material for high refractive index layer: OA600 (mixture of $Ta_2O_5$, TiO, and $Ti_2O_5$, made by Canon Optron, Inc.)

The base material described above was installed in a vacuum evaporation apparatus, and the film forming material was loaded into a second evaporation source, then deposited at a deposition rate of 3 Å/sec to form a high refractive index layer having a thickness of 30.8 nm on the low refractive index layer. The high refractive index layer was similarly formed by IAD.

On the high refractive index layer formed above, a low refractive index layer, a high refractive index layer and the uppermost layer (corresponding to the single film 1 in Example 1) were laminated under the layer thickness conditions described in Table II and formed in the same manner as the formation conditions of the low refractive index layer, to produce a dielectric multilayer film 1 having a total of five layers.

<Single Film 13: Preparation of Dielectric Multilayer Film 2>

In producing the dielectric film 1, instead of OA600 containing layer of the fourth layer, a $TiO_2$ containing layer was formed as a photocatalyst layer by IAD with a layer thickness of 113 nm. For $TiO_2$, a product of Fuji Titanium Industry Co. Ltd. (trade name: $Ti_3O_5$) was used. Then, as shown in Table II, a low refractive index layer, a high refractive index layer, and an uppermost layer having a thickness of 88 nm were formed thereon by IAD in the same manner as for producing the dielectric film 1 to obtain a dielectric multilayer film 2.

<Single Film 14: Preparation of Mirror Film 3 with Dielectric Multilayer Film>

In the production of the dielectric film 1, a polycarbonate resin film (trade name: Pure Ace, made by Teijin Ltd.) was used as a substrate, and 8 layers of $Al_2O_3$ (trade name: $Al_2O_3$, made by Merck & Co.), Ag, and H4 (trade name: "H4", $LaTiO_3$, made by Merck & Co.) were laminated as described in Table II to produce a mirror film 3 with a dielectric multilayer film.

The light absorption coefficient of Ag at a light wavelength of 550 nm in the table was calculated by the following formula.

$$\alpha = 4\pi k/\lambda$$

Here, $\alpha$ is a light absorption coefficient, k is an extinction coefficient, and $\lambda$ is a wavelength. The extinction coefficient at the wavelength was measured by ellipsometry.

<Single Film 15: Preparation of Dielectric Multilayer Film 4>

In producing the dielectric film 2, the dielectric multilayer film 4 was produced in the same manner except that a cycloolefin resin film (trade name: APEL, made by Mitsui Chemicals Co., Ltd.) was used as a substrate and the layer thicknesses of each layer were changed.

<Preparation of Single Film 16: Comparative Example>

$Na_2O$ (trade name: $Na_2O$, made by Toshima Manufacturing Co., Ltd.) was added as in the preparation of Example described in paragraph [0026] of JP-A 2013-203774, and the content of $SiO_2$ and sodium was made to be 5% by mass in accordance with paragraph [0038]. The uppermost layer was formed by coating, and a single film 16 was obtained.

<Preparation of Single Film 17: Comparative Example>

A single film 17 was obtained in the same manner as in the preparation of the single film 1, except that an uppermost layer containing no sodium was formed as an uppermost layer.

«Evaluation»

(1) Measurement of the Film Density of the Uppermost Layer

The film density of the uppermost layer of each dielectric film was measured by the following method.

(i) Only an uppermost layer was formed on a substrate made of white plate glass BK7 (made by SCHOTT AG)($\varphi$ (diameter)=30 mm, t (thickness)=2 mm), and the optical reflectance of the high refractive index layer was measured. On the other hand, (ii) theoretical value of optical reflectance of a layer made of the same materials as the uppermost layer was calculated by thin film computing software "Essential Macleod" (made by SIGMAKOKI Co., Ltd.). Then, the film density of the uppermost layer was specified by comparing the theoretical value of the optical reflectance calculated in (ii) with the optical reflectance measured in (i).

(2) Measurement of Optical Reflectance

The average optical reflectance of the sample at a wavelength of 420 to 670 nm was measured by a reflectance measuring apparatus (USPM-RUIII) (made by Olympus Corporation).

(3) Evaluation of Hydrophilicity in High-Temperature and High-Humidity Environment By leaving the sample in a high-temperature and high-humidity environment (85° C. and 85% RH) for a long period of time, the time during which the water contact angle was able to maintain at 30° or less was measured by the following measurement. The case where the water contact angle exceeded 30° at 15 hours was defined as CC, the case where it exceeded at 400 hours was defined as BB, and the case where it exceeded at 1000 hours was defined as AA. When the water contact angle values of the samples having AA evaluation at the time of storage for 1000 hours were measured, they were all 15° or less, and the sample provided with the dielectric film of the present invention was able to maintain "superhydrophilicity" for a long period of time.

<Measure of Water Contact Angle>

The contact angle was measured by measuring the contact angle between the reference liquid (pure water) and the uppermost layer surface in accordance with the method specified by JIS R3257. In the measurement conditions, at a temperature of 23° C., a humidity of 50% RH, pure water as the standard liquid was dropped on a sample by about 10 μL, and 5 locations on the sample were measured by a G-1 apparatus made by Elmer Co., Ltd., and an average contact angle was obtained from an average of the measured values. The time until the contact angle measurement is measured within 1 minute after dropping the standard liquid.

(4) Evaluation of Salt Water Resistance

The "salt water resistance" was evaluated by performing a salt water spray test using a salt-dry-wet combined cycle tester (CYP-90) (made by Suga Test Instruments Co., Ltd.). The test was carried out for 8 cycles, with the following steps (a) to (c) being one cycle.

(a) At a spray tank temperature of 35° C.±2° C., a solvent (NaCl, $MgCl_2$, or $CaCl_2$, concentration (mass ratio) 5±1%) with a salt water concentration of 5% at 25±2° C. was sprayed onto the sample for 2 hours.

(b) After completion of spraying, the sample is left in an environment of 40° C.±2° C. and 95% RH for 22 hours.

(c) Repeat steps (a) and (b) four times, and then allow the sample to stand for 72 hours in an environment of normal temperature (20° C.±15° C.) and normal humidity (45% RH to 85% RH).

After the above test, the optical reflectance of the sample was measured by a reflectance measuring apparatus (USPM-RUIII) (made by Olympus Corporation), and when there was no change in the optical reflectance (the change in reflectance was 0%), the evaluation was defined as AA, and when the change in reflectance was less than 2%, the evaluation was defined as BB, and when the change in reflectance was 2% or more, the evaluation was defined as CC.

(5) Evaluation of Scratch Resistance

The surfaces of the dielectric film samples were subjected to a 250 reciprocating rubbing test using a scrubbing brush with a load of 2 kg, and the scratch resistance was evaluated by setting the evaluation as follows. When the optical reflectance was changed by less than 0.5%, the evaluation was defined as AA, when the reflectance change was 0.5% or more to less than 2.0%, the evaluation was defined as BB, and when the reflectance change was 2.0% or more, the evaluation was defined as CC.

The above configuration and evaluation results of the single film are shown in Tables I and II.

TABLE I

| Single film No. | Layer corresponding to Uppermost layer ||||| Film density | Light absorption rate [%] Average value at wavelength of 420-670 nm | Evaluation |||| Remarks |
| | Material 1 Type | Material 2 ||| Film forming method | Layer thickness [nm] | | | Hydro-philicity in high-temperature and high-humidity | Salt water resistance | Scratch resistance | |
| | | Type | Content [% by mass] | | | | | | | | | |
|---|---|---|---|---|---|---|---|---|---|---|---|---|
| 1 | SiO$_2$ | Na$_2$O | 5.0 | IAD | 100 | >98 | 0 | AA | AA | AA | Present Invention |
| 2 | SiO$_2$ | Na$_2$O | 0.4 | IAD | 100 | >98 | 0 | BB | AA | AA | Present Invention |
| 3 | SiO$_2$ | Na$_2$O | 1.0 | IAD | 100 | >98 | 0 | BB | AA | AA | Present invention |
| 4 | SiO$_2$ | K$_2$O | 5.0 | IAD | 100 | >98 | 0 | AA | AA | AA | Present Invention |
| 5 | SiO$_2$ | CaO | 5.0 | IAD | 100 | >98 | 0 | AA | AA | AA | Present Invention |
| 6 | SiO$_2$ | Fe$_2$O$_3$ | 5.0 | IAD | 100 | >98 | 3 | AA | AA | AA | Present Invention |
| 7 | SiO$_2$ | Na$_2$O | 10.0 | IAD | 100 | >98 | 0 | BB | AA | AA | Present Invention |
| 8 | SiO$_2$ | Na$_2$O | 5.0 | IAD | 100 | 92 | 0 | BB | AA | AA | Present Invention |
| 9 | SiO$_2$ | MgO | 5.0 | IAD | 100 | >98 | 0 | BB | AA | AA | Present Invention |
| 10 | SiO$_2$ | Na$_2$O + K$_2$O + CaO | 5.0 | IAD | 100 | >98 | 0 | AA | AA | AA | Present Invention |
| 11 | SiO$_2$ | Na$_2$O | 5.0 | Sputtering | 100 | >98 | 0 | BB | AA | AA | Present Invention |
| 12 | Dielectric multilayer film 1 | Na$_2$O | 5.0 | IAD | 86.5 | >98 | 0 | AA | AA | AA | Present Invention |
| 13 | Dielectric multilayer film 2 | Na$_2$O | 5.0 | IAD | 88 | >98 | 0 | AA | AA | AA | Present invention |
| 14 | Mirror film 3 with dielectric multilayer film | Na$_2$O | 5.0 | IAD | 24 | >98 | 0 | AA | AA | AA | Present Invention |
| 15 | Dielectric multilayer film 4 | Na$_2$O | 5.0 | IAD | 84 | >98 | 0 | AA | AA | AA | Present Invention |
| 16 | SiO$_2$ | Na$_2$O | 5.0 | Coating | 100 | 85 | 0 | BB | CC | CC | Comparative Example |
| 17 | SiO$_2$ | — | — | IAD | 100 | >98 | 0 | CC | AA | AA | Comparative Example |

TABLE II

| Layer number | Layer material | Layer thickness [nm] | Refractive index |
|---|---|---|---|
| <Dielectric multilayer film 1> | | | |
| 5 (Uppermost layer) | SiO$_2$ | 86.5 | 1.429 |
| 4 | OA600 | 133.0 | 2.104 |
| 3 | SiO$_2$ | 27.6 | 1.429 |
| 2 | OA600 | 30.8 | 2.104 |
| 1 | SiO$_2$ | 19.5 | 1.429 |
| Substrate | TAFD5G | | 1.835 |
| <Dielectric multilayer film 2> | | | |
| 5 (Uppermost layer) | SiO$_2$ | 88.0 | 1.429 |
| 4 (Functional layer) | TiO$_2$ | 113.0 | 2.132 |
| 3 | SiO$_2$ | 32.2 | 1.429 |
| 2 | OA600 | 30.0 | 2.104 |
| 1 | SiO$_2$ | 31.7 | 1.429 |
| Substrate | TAFD5G | | 1.835 |

| Layer number | Layer material | Layer thickness [nm] | Refractive index | Light absorption coefficient |
|---|---|---|---|---|
| <Mirror film 3 with dielectric multilayer film> | | | | |
| 8 (Uppermost layer) | SiO$_2$ | 24 | 1.462 | 0 |
| 7 | H4 | 79 | 2.05437 | 0 |
| 6 | SiO$_2$ | 17 | 1.462 | 0 |
| 5 | H4 | 72 | 2.05437 | 0 |
| 4 | Al$_2$O$_3$ | 34 | 1.61191 | 0 |
| 3 | Ag | 80 | 0.051 | 2.96 |
| 2 | H4 | 40 | 2.05437 | 0 |
| 1 | Al$_2$O$_3$ | 65 | 1.61191 | 0 |
| Substrate | PC | | 1.835 | 0 |

| Layer number | Layer material | Layer thickness [nm] | Refractive index |
|---|---|---|---|
| <Dielectric multilayer film 4> | | | |
| 5 (Uppermost layer) | SiO$_2$ | 84.0 | 1.462 |
| 4 (Functional layer) | TiO$_2$ | 110.0 | 2.344 |
| 3 | SiO$_2$ | 30.3 | 1.462 |
| 2 | OA600 | 20.7 | 2.094 |
| 1 | SiO$_2$ | 16.3 | 1.462 |
| Substrate | APEL | | 1.547 |

From the results shown in Table I, it is clear that, compared with the single films 16 and 17 of the comparative examples, the single films 1 to 15 corresponding to the uppermost layer according to the present invention have high film density and excellent hydrophilicity, salt water resistance and scratch resistance under a high-temperature and high-humidity environment.

Example 2

In order to evaluate the optical reflectivity and the photocatalytic property of the dielectric multilayer film 2, pores were formed in the uppermost layer by the following procedure, and the dielectric multilayer film 2 with pores was produced and evaluated.

According to the pore forming method shown in FIG. 4 and FIG. 5, pores shown in FIG. 6C were formed in the uppermost layer under the conditions of: Ag as a mask material, vapor deposition method as a mask film formation method, a mask thickness of 12 nm, a leaf vein shape as a mask structure, CHF$_3$ as an etching gas, and an etching time of 60 sec. A dielectric multilayer film 2 with pores was produced.

The detailed pore forming conditions are as follows.

A film forming apparatus (BES-1300) (made by Shincron Co., Ltd.) was used for forming an Ag film. A film was formed under the following conditions. By changing the film thickness at the time of film formation, Ag masks of a leaf vein shape, a porous shape, and a particle shape can be formed.

Heating temperature: 25° C.

Starting vacuum level: 1.33×10$^{-3}$ Pa

Film forming rate: 7 Å/sec

An etching apparatus (CE-300I) (made by ULVAC, Inc.) was used for etching, and the film was formed under the following condition. The width length and depth of pores were adjusted by changing the etching time.

Antenna RF: 400 W

Bias RF: 38 W

APC pressure: 0.5 Pa

CHF$_3$ flow: 20 sccm

Etching time: 60 sec

<Peeling of Mask>

After forming the pores, the mask material Ag was peeled off by irradiating with O$_2$ plasma using an etching apparatus (CE-300I) (made by ULVAC, Inc.). The peeling was performed under the following conditions.

Antenna RF: 400 W

Bias RF: 38 W

APC pressure: 0.5 Pa

O$_2$ flow: 50 sccm

Etching time: 600 sec

«Evaluation»

In addition to the evaluation of Example 1, the following evaluations were carried out.

(4) Evaluation of Optical Reflectance

As for the "optical reflectance", the reflectance of the sample was evaluated using a reflectance measuring apparatus (USPM-RUIII) (made by Olympus Corporation) with the highest reflectance in the wavelength range of 420 nm to 670 nm. Here, when the reflection is 1% or less, the evaluation is denoted by AA, and when the reflectance is more than 1% and 2% or less, the evaluation is denoted by BB.

(5) Evaluation of the Photocatalytic Effect

Regarding the "photocatalytic effect", the pen-colored sample was irradiated with UV irradiation for a total of 20 J in an environment of 20° C. and 80%, and the color change of the pen was evaluated in a stepwise manner. Specifically, a pen "The visualizer" (made by Inkintelligent Corporation) was used as the pen. Here, those having a large degree of color change (or the color disappears) is evaluated as AA as the photocatalytic effect is sufficient, when a slight color remains is evaluated as photocatalytic effect BB, the case where the color remains clearly (photocatalytic effect is deactivated) is evaluated as CC.

The configuration and the evaluation results of the dielectric film are shown in Table III.

TABLE III

| Dielectric multilayer film No. | Uppermost layer | | | | | Layer directly below the uppermost layer | Evaluation | | | | Remarks |
|---|---|---|---|---|---|---|---|---|---|---|---|
| | Material 1 Type | Material 2 Type | Content [% by mass] | Film forming method | Layer thickness [nm] | Film density | | Hydrophilicity in high-temperature and high-humidity | Salt water resistance | Optical reflectance | Photocatalytic property | |
| 1 | SiO$_2$ | Na$_2$O | 5.0 | IAD | 100 | >98 | 0A600 | AA | AA | BB | — | Present Invention |
| 2 | SiO$_2$ | Na$_2$O | 5.0 | IAD | 100 | >98 | TiO$_2$ | AA | AA | AA | AA | Present Invention |

The dielectric multilayer films 1 and 2 are excellent in hydrophilicity, salt water resistance, and optical reflectance in long-term storage in a high-temperature and high-humidity environment. In addition, it was found that the dielectric multilayer film 2 had a photocatalytic effect and was excellent in self-cleaning property.

INDUSTRIAL APPLICABILITY

The dielectric film of the present invention has an anti-reflection property, excellent salt water resistance and scratch resistance of the surface, and since it is a dielectric film capable of maintaining a low water contact angle over a long period under a high-temperature and high-humidity environment, it is suitably used for in-vehicle lenses and communication lenses, or building materials, among others it is suitable as an in-vehicle lens.

DESCRIPTION OF SYMBOLS

1: IAD evaporation apparatus
2: Chamber
3: Dome
4: Substrate
5: Deposition source
6: Deposition material
7: IAD ion source
8: Ion beam
30: Pore
50: Metal mask
50a: Metal portion
50b: Exposed portion
100: Dielectric film (optical member)
101: Substrate
102 and 104: Low refractive index layer
103 and 105a: High refractive index layer
105b: Functional layer
106: Uppermost layer

What is claimed is:

1. A dielectric film provided on a transparent substrate, wherein the dielectric film has at least one low refractive index layer, and an uppermost layer of the dielectric film contains SiO$_2$ and has a film density of 92% or more, and the uppermost layer contains an element having an electronegativity smaller than Si,
    a functional layer containing a metal oxide having a photocatalytic function as a main component is further provided on a transparent substrate side of the uppermost layer, and
    the uppermost layer has a plurality of pores that partially expose a surface of the functional layer.

2. The dielectric film described in claim 1, wherein the uppermost layer contains an element selected from the group consisting of sodium, calcium, potassium and magnesium.

3. The dielectric film described in claim 1, wherein a content of sodium, calcium, potassium, and magnesium in the uppermost layer is in the range of 0.5 to 10% by mass, and a layer thickness of the uppermost layer is 1 μm or less.

4. The dielectric film described in claim 1, wherein the uppermost layer has a film density of 98% or more.

5. The dielectric film described in claim 1, wherein a water contact angle of the uppermost layer is 30° or less after being stored for 1000 hours in an environment of 85° C. and 85% RH.

6. An optical member comprising the dielectric film described in claim 1.

7. The optical member described in claim 6, wherein the optical member is an in-vehicle lens.

8. A method of producing a dielectric film provided on a transparent substrate, comprising the steps of:
    forming at least one low refractive index layer;
    forming an uppermost layer containing SiO$_2$ and an element selected from the group consisting of sodium, calcium, potassium, and magnesium;
    forming a functional layer containing a metal oxide having a photocatalytic function as a main component on a transparent substrate side of the uppermost layer; and
    forming a plurality of pores in the uppermost layer, the pores partially exposing a surface of the functional layer.

9. The method of producing a dielectric film described in claim 8, comprising the step of forming the dielectric film by an ion assisted deposition method or a sputtering method.

* * * * *